United States Patent [19]
Ohkawa et al.

[11] Patent Number: 5,894,436
[45] Date of Patent: Apr. 13, 1999

[54] NONVOLATILE SEMICONDUCTOR MEMORY HAVING MEMORY CELLS EACH STORING MULTI-BITS INFORMATION

[75] Inventors: Masayoshi Ohkawa; Toshio Takeshima, both of Tokyo, Japan

[73] Assignee: NEC Corporation, Tokyo, Japan

[21] Appl. No.: 08/960,437

[22] Filed: Oct. 29, 1997

[30] Foreign Application Priority Data

Oct. 29, 1996 [JP] Japan .................................. 8-286644

[51] Int. Cl.$^6$ ........................................... G11C 11/34
[52] U.S. Cl. ........................ 365/185.03; 365/185.18; 365/189.05; 365/189.07; 365/189.09
[58] Field of Search ........................ 365/185.03, 185.18, 365/189.05, 189.07, 189.09, 230.08

[56] References Cited

U.S. PATENT DOCUMENTS

| | | | |
|---|---|---|---|
| 5,043,940 | 8/1991 | Harari | 365/185 |
| 5,550,772 | 8/1996 | Gill | 365/185.03 |
| 5,768,191 | 6/1998 | Choi et al. | 365/185.22 |
| 5,815,436 | 9/1998 | Tanaka et al. | 365/185.03 |

*Primary Examiner*—David Nelms
*Assistant Examiner*—Tuan T. Nguyen
*Attorney, Agent, or Firm*—Sughrue, Mion, Zinn Macpeak & Seas, PLLC

[57] ABSTRACT

A variation in threshold of a memory cell is detected at a higher speed. A multi-valued nonvolatile semiconductor memory has a nonvolatile memory cell 41 for storing n-values ($n \geq 3$) of data as thresholds in one cell, a reference signal generator 44 for emitting a reference signal group Vri ($i \leq (n-1)$), a reference signal group VriH(=Vri+$\Delta$V) and a reference signal group VriL(=Vri-$\Delta$V), a differential amplifier 43 for receiving either one of signals Vci (Vci<VriL<Vri<VriH<Vc(i+1)) corresponding to the stored data in the memory cell 41 at one input terminal and receiving the reference signal groups Vri, VriH or VriL at the other input terminal, a latch circuit 46 for latching output of the differential amplifier 43, a comparator 47 for comparing the output of the differential amplifier 43 with the output of the latch circuit 46, and a controller 48 for emitting control signals D1 to D6 in accordance with the output of the latch circuit 46 and controlling the differential amplifier 43 and the comparator 47.

9 Claims, 11 Drawing Sheets

NONVOLATILE SEMICONDUCTOR MEMORY HAVING MEMORY CELLS EACH STORING MULTI-BITS INFORMATION

BACKGROUND OF THE INVENTION

The present invention relates to a nonvolatile semiconductor memory in which each of memory cells is made of an insulated gate transistor having a floating gates and stores multi-bits information of plural bits data.

A flash memory or another nonvolatile memory has a structure in which an MOS transistor usually provided with a floating gate constituting a charge storage layer and a control gate laminated therein forms one cell. By controlling a threshold of the transistor with a charge stored in the charge storage layer, data is stored. For a relationship between a type of data stored in one cell of a multi-valued memory and a number of thresholds, when two values are stored in one cell, two thresholds are controlled, while when n-values are stored in one cell, n-thresholds are controlled. In the same manner, when m-ary k-bits (an integer of m≧2, an integer of k≧2 (m=2), or an integer of k≧1 (m≧3)) are stored in one cell, $m^k$ thresholds need to be controlled.

Here, the charge stored in the charge storage layer of the memory cell varies with a leakage from the charge storage layer and a disturbance received when data is read from or written into another surrounding memory cell. In this case, there is a possibility that the threshold is changed and the data is destroyed. Especially, in the multi-valued memory in which a large number of thresholds need to be controlled, a margin for allowing a variation in threshold is reduced.

As one of methods for preventing an error caused by a variation of threshold, the variation of threshold is detected before the variation of threshold exceeds its tolerance, so that the memory cell is returned to its correct condition. Such prior art is proposed in a publication of the patent application laid-open No. 8-77785 which relates to a semiconductor memory device. In the following the prior art is described using drawings.

FIGS. 10 and 11 are explanatory views of a method of detecting a variation of threshold according to the prior art. FIG. 10 is a circuit diagram showing a constitution of the semiconductor memory device described in the aforementioned publication. FIG. 11 is a voltage distribution diagram showing a method of determining multiple values and a variation of threshold in FIG. 10, and shows a relationship between a threshold and a word line voltage when four values (binary two bits) are stored in a memory cell. In the following, the case four values are stored is described.

In the circuit diagram of FIG. 10, a constitution is provided with a memory cell 61, a load 62, an amplifier 63 for detecting a variation in level of a contact N6, a word line voltage generator 69 for generating a stepped word line voltage, an output circuit 65 for determining outputs o1, o2 from outputs of the word line voltage generator 69 and the amplifier 63 for emitting the outputs, a latch circuit 66 for latching the outputs o1, o2 and emitting outputs o1*, o2*, and a comparator 67 for comparing the outputs o1, o2 of the output circuit 65 with the outputs o1* and o2* of the latch circuit 66 and emitting a threshold voltage variation signal s when a variation in threshold voltage is detected. The memory cell 61 and the load 62 constitute a bit line. Detailed structure is not an essential portion in the invention, therefore its description is omitted.

In FIG. 11, initial distributions A, B, C and D of thresholds in the contact NE when data is read from the memory cell correspond to stored data "11", "10", "01" and "00", respectively. Word line voltages Vwa, Vwb, Vwc are applied to a control gate of the memory cell 61. In the prior art, reading is performed while gradually increasing the word line voltage to Vwa, Vwb, then Vwc sequentially.

Here, when the threshold is in a position b, no current flows in the memory cell at the word line voltage of Vwa. However, when the voltage increases to Vwb, a current flows. Specifically, the cell turns on at Vwa and off at Vwb and Vwc. Then, it can be determined that the threshold is in the position b, i.e. within a range of B (data "10").

However, when the threshold, which has been at the position b (Vwa≦b≦Vwb) at the time of writing, varies exceeding a range of Vwa and Vwb, the threshold is determined as another value, thereby causing an error. To avoid the error, a threshold verifying means is applied in which a cell with a threshold varying but within a tolerance is found and repaired. In the prior art shown in FIG. 11, word line voltages VwaH, VwbH, VwcH and word line voltages VwaL, VwbL, VwcL are used as the threshold verifying means.

Here, when data "10" is stored, the threshold is in the position b. In this case, for a verifying process, reading is first performed at the usual word line voltages Vwa, Vwb and Vwc, the data is determined to be "10", and is then latched in the latch circuit 66.

Subsequently, at the word line voltages VwaH, VwbH, VwcH, reading is performed. Here, as shown in FIG. 11, when the threshold varies from the position b to b1, the memory cell turns on at all the voltages VwaH, VwbH, VwcH, then the data is determined to be "11", which is compared by the comparator 67 with the latched data "10". As a result, they do not coincide with each other, and the variation in threshold voltage can be detected. Subsequently, a threshold voltage variation signal s indicating that the variation in threshold voltage is detected is emitted from the comparator 67. After the variation in threshold is detected, a rewriting operation is performed, so that the threshold again falls within the range B. Since the rewriting operation is not handled in the invention, its description is omitted.

When, at the time of reading at the word line voltages VwaH, VwbH, VwcH, no variation in threshold is detected, the data "10" latched in the latch circuit 66 is not canceled, then reading is performed at the word line voltages VwaL, VwbL, VwcL. Here, as shown in FIG. 11, when the threshold varies from the position b to b2, the memory cell turns off at VwaL, VwbL and turns on at VwcL, then the data is determined to be "01", which is compared by the comparator 67 with the latched data "10". As a result, they do not coincide with each other, and the variation in threshold voltage can also be detected. Subsequently, the threshold voltage variation signal s indicating that the variation in threshold voltage is detected is emitted from the comparator 67. After the variation in threshold is detected, the rewriting operation is performed, so that the threshold again falls within the range B.

If at the time of detection both at the word line voltages VwaH, VwbH, VwcH and the word line voltages VwaL, VwbL, VwcL, the threshold voltage variation signal s is not emitted (for example, when the threshold is in a position b#), then it is determined there is no variation in threshold voltage.

In this manner, by using nine types of word line voltages, the variation in threshold and a direction of the variation can be detected. Also, in the prior art, no determination is made when the threshold of the memory cell becomes negative or higher than D. However, by increasing the types of word line voltages, the determination can be made.

In the aforementioned prior art, for reading out one data, three types of word line voltages need to be changed. Therefore, problem is a low reading speed. Also, the voltage needs to be changed over eight times at maximum. The word line voltage needs to be fixed until the output of the amplifier is stabilized and a comparison result is attained. There is a problem that a long time is required for the verifying process. Further, for the verifying process, nine types of word line voltages in total are necessary. Therefore, another problem is that a structure of the word line voltage generator is complicated.

SUMMARY OF THE INVENTION

An object of the present invention is to provide a multi-valued nonvolatile semiconductor memory which can detect a variation in threshold of a memory cell at a higher speed.

To attain this and other objects, the present invention provides a multi-valued nonvolatile semiconductor memory having a floating gate MOS structure as a circuit constitution, provided with a nonvolatile memory cell [41] for storing n-values (n=3, 4, 5, . . . ) of data as different thresholds in one cell, (n−1) units of reference signal generators [44a to 44c] for emitting a first group of different reference signals Vri (i=1, 2, . . . , (n−1)), and (n−1) units of differential amplifiers [43a to 43c] for reading from the nonvolatile memory cell [41] either one of different signals Vci (i=1, 2, . . . , (n−1); Vci<Vri<Vc(i+1)) corresponding to the n-values of stored data, the read signal being transmitted to one input terminals and respective different signals of the first reference signal group Vri being transmitted to the other input terminals of the differential amplifiers. The multi-valued nonvolatile semiconductor memory also has (n−1) units of latch circuits [46a to 46c] for latching respective outputs of the differential amplifiers [43a to 43c], (n−1) units of comparators [47a to 47c] for comparing the respective outputs of the differential amplifiers [43a to 43c] with respective outputs of the latch circuits [46a to 46c], and a controller [48] for emitting control signals [D1 to D6] in accordance with the respective outputs of the latch circuits [46a to 46c] and controlling the differential amplifiers [43a to 43c] and the comparators [47a to 47c]. The reference signal generators [44a to 44c] emit the first reference signal group Vri, a second reference signal group VriH (Vri<VriH<Vc(i+1)) shifted as much as ΔV to an upper order from the first reference signal group Vri in accordance with the control signals [D1 to D6], and a third reference signal group VriL (Vci<VriL<Vri) shifted as much as ΔV to a lower order from the first reference signal group Vri in accordance with the control signals [D1 to D6].

The aforementioned multi-valued nonvolatile semiconductor memory of the invention has a first operation in which by using the first reference signal group Vri emitted by the reference signal generators [44a to 44c], the stored data in the nonvolatile memory cell [41] is read out to the differential amplifiers [43a to 43c]; a second operation in which the latch circuits [46a to 46c] latch first outputs of the differential amplifiers [43a to 43c]; a third operation in which when the signal Vci is Vcx (x is either one of 1, 2, . . . , (n−1)), the controller [48] generates the control signals [D1 to D6] and changes Vr(x−1) and Vrx of the first reference signal group Vri to the second reference signal Vr(x−1)H and the third reference signal VrxL, respectively; a fourth operation in which by using the changed second and third reference signals Vr(x−1) H and VrxL emitted from the reference signal generators [44a to 44c], the stored data in the nonvolatile memory cell [41] is again read out to the differential amplifiers [43a to 43c]; and a fifth operation in which the comparators [47a to 47c] compare the first outputs of the differential amplifiers [43a to 43c] latched in the latch circuits [46a to 46c] by the second operation with new second outputs of the differential amplifiers [43a to 43c] read by the fourth operation. As a result of comparison in the fifth operation, when the first outputs do not coincide with the second outputs, threshold voltage variation signals [s1 to s3] are emitted, thereby ending the verifying process.

Also, the invention provides a multi-valued nonvolatile semiconductor memory having a floating gate MOS structure as a circuit constitution, provided with a nonvolatile memory cell [11] for storing $m^k$-values (an integer of m≧2, an integer of k≧2 (m=2), or an integer of k≧1 (m≧3)) of data as different thresholds in one cell; ($m^k$−1) units of reference signal generators [14a to 14c] for emitting a first group of different reference signals Vri (i=1, 2, . . . , ($m^k$−1)); ($m^k$−1) units of differential amplifiers [13a to 13c] for reading from the nonvolatile memory cell [11] either one of different signals Vci (i=1, 2, . . . , ($m^k$−1); Vci<Vri<Vc(i+1)) corresponding to the $m^k$-values of stored data, the read signal being transmitted to one input terminals and respective different signals of the first reference signal group Vri being transmitted to the other input terminals of the differential amplifiers; and an encoder [15] for receiving outputs of the differential amplifiers [13a to 13c] and converting to m-ary data. The multi-valued nonvolatile semiconductor memory also has a latch circuit [16] for latching the output of the encoder [15] at a first clock signal timing, a comparator [17] for comparing the output of the encoder [15] with an output of the latch circuit [16] at a second clock signal timing, and a controller [18] for emitting control signals [A1 to A6] in accordance with the output of the latch circuit [16]. The reference signal generators [14a to 14c] emit the first reference signal group Vri, a second reference signal group VriH (Vri<VriH<Vc(i+1)) shifted as much as ΔV to an upper order from the first reference signal group Vri in accordance with the control signals [A1 to A6], and a third reference signal group VriL (Vci<VriL<Vri) shifted as much as ΔV to a lower order from the first reference signal group Vri in accordance with the control signals [A1 to A6].

The aforementioned multi-valued nonvolatile semiconductor memory of the invention has a first operation in which by using the first reference signal group Vri emitted by the reference signal generators [14a to 14c], the stored data in the nonvolatile memory cell [11] is read out to the differential amplifiers [13a to 13c], and the signal Vci is converted to a first m-ary data in the encoder [15]; a second operation in which the latch circuit [16] latches the first m-ary data at the first clock signal timing; a third operation in which when the signal Vci is Vcx (x is either one of 1, 2, . . . , ($m^k$−1)), the controller [18] generates the control signals [A1 to A6] and changes outputs of the reference signal generators [14a to 14c] from Vr(x−1) and Vrx of the first reference signal group Vri to the second reference signal Vr(x−1) H and the third reference signal VrxL, respectively; a fourth operation in which by using the changed second and third reference signals Vr(x−1)H and VrxL emitted from the reference signal generators [14a to 14c], the stored data in the nonvolatile memory cell [11] is again read out to the differential amplifiers [13a to 13c], and the signal Vci is converted to a second m-ary data in the encoder [15]; a fifth operation in which the comparator [17] compares the first m-ary data latched in the latch circuit [16a] by the second operation with the second m-ary data converted by the fourth operation at the second clock signal timing; and a sixth operation in which as a result of comparison in the fifth operation, when the first m-ary data coincides with the second m-ary data, a verifying process is ended, and when the first m-ary data does not coincide with the second m-ary data, a threshold voltage variation signal [s] is emitted, thereby ending the verifying process.

Also, the aforementioned multi-valued nonvolatile semiconductor memory of the invention has a first operation in which by using the first reference signal group Vri emitted by the reference signal generators [24a to 24c], the stored data in the nonvolatile memory cell [21] is read out to the differential amplifiers [23a to 23c], and the signal Vci is converted to a first m-ary data in the encoder [25]; a second operation in which the latch circuit [26] latches the first m-ary data at the first clock signal timing; a third operation in which outputs of the reference signal generators [24a to 24c] are changed from the first reference signal group Vri to the second reference signal VriH; a fourth operation in which by using the changed second reference signal VriH emitted from the reference signal generators [24a to 24c], the stored data in the nonvolatile memory cell [21] is again read out to the differential amplifiers [23a to 23c], and the signal Vci is converted to a second m-ary data in the encoder [25]; a fifth operation in which the comparator [27] compares the first m-ary data latched by the second operation with the second m-ary data converted by the fourth operation for the first time at the second clock signal timing; a sixth operation in which as a result of comparison in the fifth operation, when the first m-ary data coincides with the second m-ary data, the process goes to a seventh operation, and when the first m-ary data does not coincide with the second m-ary data, a first threshold voltage variation signal [s] is emitted, ending the verifying process; a seventh operation in which the outputs of the reference signal generators [24a to 24c] are changed from the second reference signal VriH to the third reference signal VriL; an eighth operation in which by using the changed third reference signal VriL emitted from the reference signal generators [24a to 24c], the stored data in the nonvolatile memory cell [21] is further again read out to the differential amplifiers [23a to 23c], and the signal Vci is converted to a third m-ary data in the encoder [25]; a ninth operation in which the comparator [27] compares the first m-ary data latched by the second operation with the third m-ary data converted by the seventh operation for the second time at the second clock signal timing; and a tenth operation in which as a result of comparison in the ninth operation, when the first m-ary data coincides with the third m-ary data, the verifying process is ended, and when the first m-ary data does not coincide with the third m-ary data, a second threshold voltage variation signal [s] is emitted, ending the verifying process.

In the aforementioned multi-valued nonvolatile semiconductor memory, the reference signal generator has a first load provided with an MOS transistor [51] connected between a power source [Vcc] and a first contact [R1], a second load provided with an MOS transistor [52] connected between the first contact [R1] and a second contact [R2], and first, second and third MOS transistors [55, 54, 53] with drains connected to the second contact [R2], sources connected to a ground potential [GND] and gates connected to control signals [RH, RM, RL], respectively. A voltage of the first contact [R1] is used as a reference signal. When the first reference signal Vri is emitted, electricity is conducted to the first and second MOS transistors [55, 54]. When the second reference signal VriH is emitted, electricity is conducted only to the first MOS transistor [55]. When the third reference signal VriL is emitted, electricity is conducted to all the first, second and third MOS transistors [55, 54, 53].

Also, in the aforementioned multi-valued nonvolatile semiconductor memory of the invention, the reference signal generator has the first load provided with the MOS transistor [51] connected between the power source [Vcc] and the first contact [R1], the second load provided with the MOS transistor [52] connected between the first contact [R1] and the second contact [R2], and the first, second and third MOS transistors [55, 54, 53] with the drains connected to the second contact [R2], the sources connected to the ground potential [GND] and the gates connected to the control signals [RH, RM, RL], respectively. The voltage of the first contact [R1] is used as the reference signal. Respective conducting resistances TR3, TR2 and TR1 of the first, second and third MOS transistors [55, 54, 53] have a relationship of TR1<TR2<TR3. When the first reference signal Vri is emitted, electricity is conducted to the second MOS transistor [54]. When the second reference signal VriH is emitted, electricity is conducted to the first MOS transistor [55]. When the third reference signal VriL is emitted, electricity can be transmitted to the third MOS transistor [53].

In this manner, since by using a plurality of reference voltages, a multi-valued determination is made, the changing over of the word line voltage is unnecessary. Also, since by comparing bit line voltages of the read memory cell with the fixed word line voltages, data is determined all at once, the reading operation itself can be achieved at a high speed. Further, the word line voltages are fixed, the circuit constitution of the word line voltage generator can be simplified.

Also, for the verifying process, since the voltage is changed only once or twice, the frequency of the verifying process can be decreased as compared with the prior art. Therefore, the verifying process can be achieved at a high speed. Also, there are individual outputs from the individual reference signal generators, the circuit constitution can be simplified as compared with the prior art.

DETAILED DESCRIPTION OF THE PREFERRED EMBODIMENTS

Embodiments of the present invention are now described with reference to the accompanying drawings.

FIRST EMBODIMENT

Figure 1:
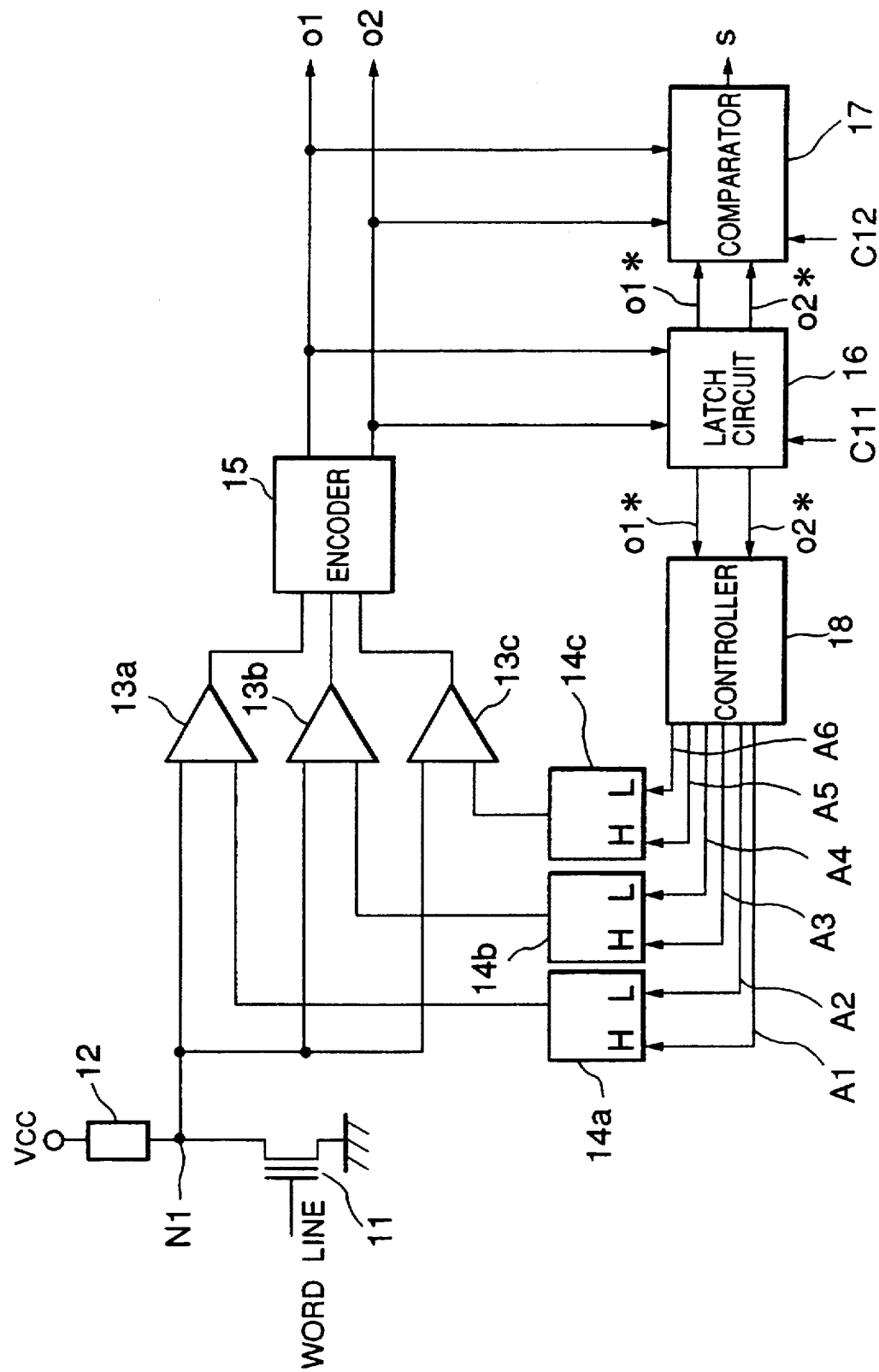
FIG. 1 is a circuit diagram showing a constitution of a semiconductor memory device according to a first embodiment of the present invention.
Figure 2:
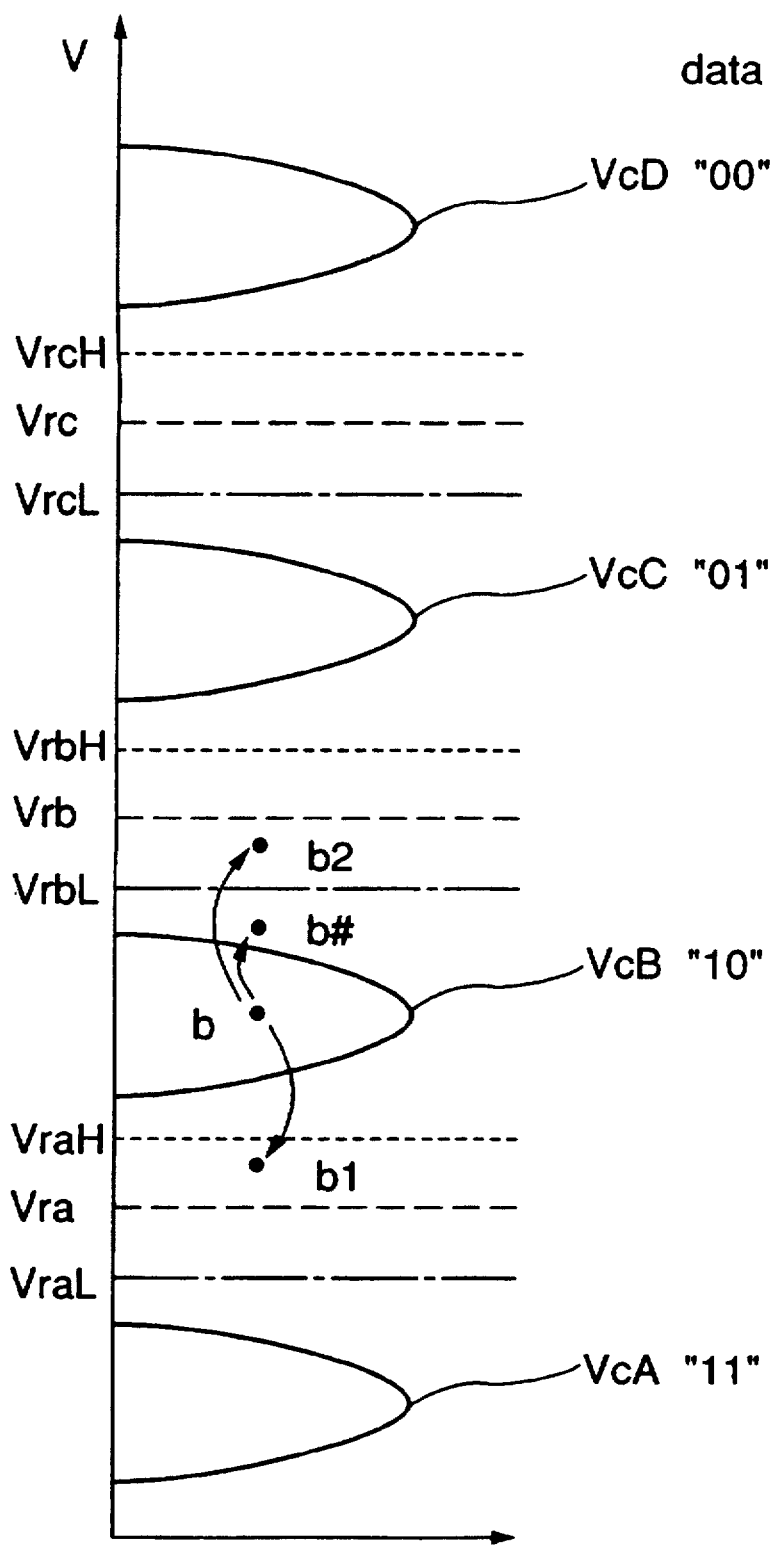
FIG. 2 is a voltage distribution diagram showing a method of determining multiple values and threshold variations in FIG. 1.
Figure 3:
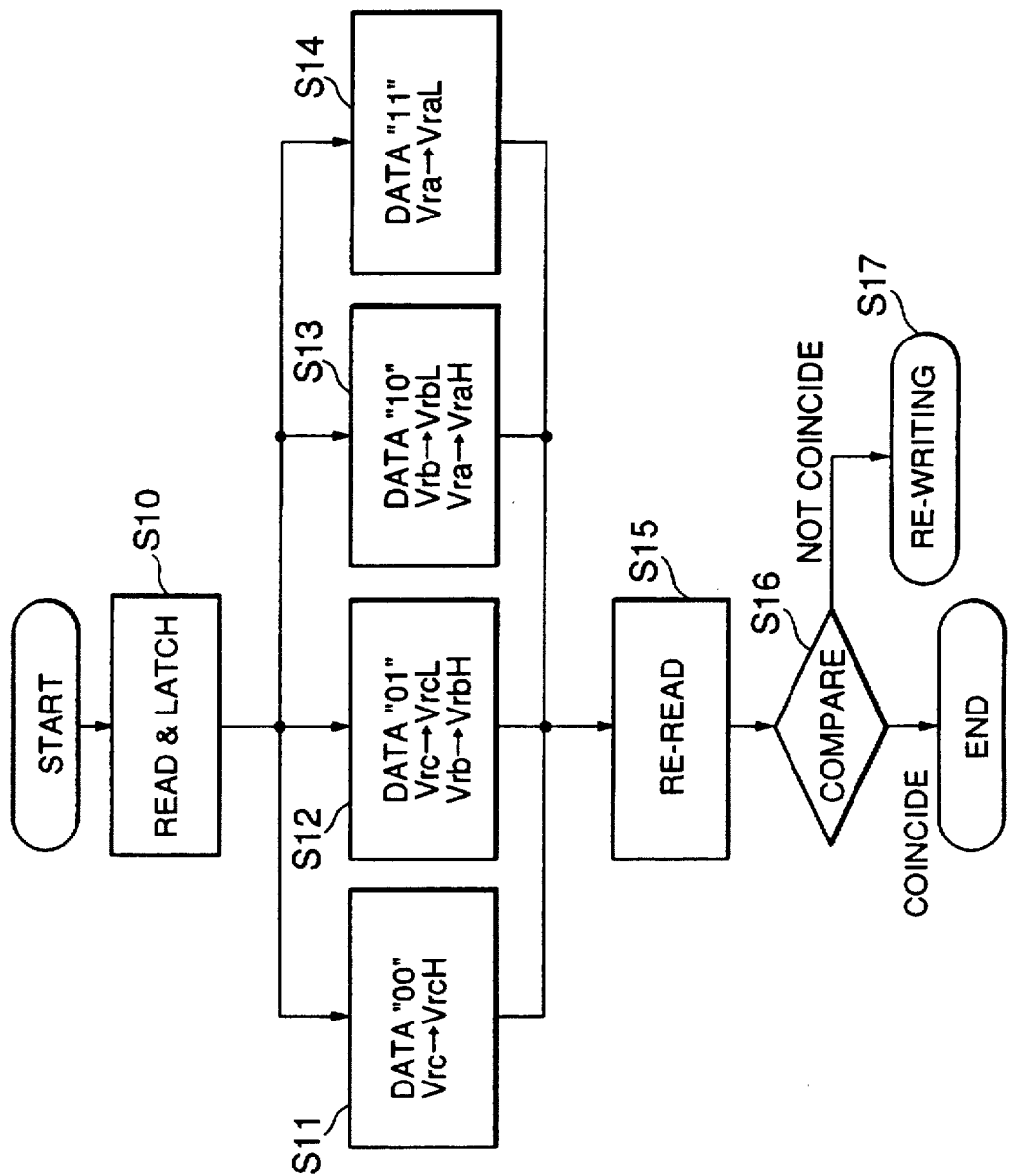
FIG. 3 is a flowchart showing operation of FIG. 1.

FIG. 1 is a circuit diagram showing a constitution of a semiconductor memory device in a first embodiment of the invention. FIG. 2 is a voltage distribution diagram showing a method of determining multiple values and threshold variations in FIG. 1. FIG. 3 is a flowchart showing operation of FIG. 1.

The semiconductor memory device shown in FIG. 1 has a floating gate MOS structure as the circuit constitution, and is constituted of a memory cell 11, a load 12, differential amplifiers 13a to 13c, reference signal generators 14a to 14c, an encoder 15, a latch circuit 16, a comparator 17 and a controller 18. A drain terminal of the memory cell 11 and the load 12 are connected parallel with a contact N1 in a circuit.

The memory cell 11 stores in one cell four values (binary two bits) of data as different thresholds. The reference signal generators 14a to 14c have input of control signals A1 and A2, A3 and A4, A5 and A6, respectively, and emit reference signals Vra, Vrb, Vrc used for usual reading and reference signals used for verifying operation VraL and VraH, VrbL and VrbH, VrcL and VrcH, in accordance with A1 to A6. The differential amplifiers 13a to 13c read from the memory cell 11 either one of signals corresponding to the stored data of levels VcA, VcB, VcC, VcD at the contact N1, and each receives each signal at one input terminal. Respective outputs of the reference signal generators 14a to 14c are transmitted to the other input terminals. The encoder 15 converts the output of the differential amplifiers 13a to 13c into binary data, and emits data o1 and o2. The latch circuit 16 latches the data o1 and o2 emitted from the encoder 15 at a timing of a clock signal C11 and emits data o1* and o2*. The comparator 17 receives and compares the data o1, o2 emitted from the encoder 15 and the data o1*, o2* emitted from the latch circuit 16 at a timing of a clock signal C12. When the comparison results in non-coincidence, a threshold voltage variation signal s is emitted. The controller 18 receives o1* and o2* latched in the latch circuit 16 and emits the control signals A1 to A6.

As shown in FIG. 2, VcA to VcD show a voltage distribution at the contact N1 when the stored data in the memory cell 11 is read out, and correspond to the stored data "11", "10", "01" and "00", respectively. The reference signals Vra, Vrb and Vrc are used for usual reading by using the reference signal generators 14a to 14c, respectively. The reference signals VraL and VraH, VrbL and VrbH, and VrcL and VrcH are used at the time of verifying. The reference signals VraH, VrbH, VrcH are signals shifted to the upper order by ΔV from the reference signals Vra, Vrb, Vrc, respectively. The reference signals VraL, VrbL, VrcL are signals shifted to the lower order by ΔV from the reference signals Vra, Vrb, Vrc, respectively.

Using FIG. 3, operation of FIG. 1 is described. When reading is performed in FIG. 1, the signal Vci corresponding to the stored data read from the memory cell 11 is compared with Vra to Vrc at once. Specifically, when determining VcB, the outputs of the differential amplifiers 13a to 13c emit are, for example, "1", "0" and "0", respectively, which are converted to data "10" by the encoder 15. At the time of performing the verifying process, the outputs are latched in the latch circuit 16 at the timing of clock signal C11. In accordance with the latched data, the controller 18 generates the control signals A1 to A6. In this manner, reading and latching are performed (S10).

When the latched data is "10", reference signals necessary for determining a threshold variation are, as shown in FIG. 2, VraH and VrbL, and therefore the controller 18 emits only A2 and A3 (S13). Thereby, the subsequent reading is performed with the reference signals VraH, VrbL and Vrc.

Here, when the potential of N1, i.e. the threshold varies from the position b to b1, the output of the encoder 15 is data "11", and when the threshold varies to the position b2, the output of the encoder 15 is data "01". By comparing the output with the data "10" latched in the latch circuit 16 with the comparator 17 at the timing of clock signal C12, a variation in threshold and a direction of the variation in threshold can be determined by one verifying process.

In the same manner, when the latched data is "00", for the subsequent reading, VrcH is used (S11). When the latched data is "01", for the subsequent reading, VrbH and VrcL are used (S12). When the latched data is "11", for the subsequent reading, VraL is used (S14). Also in the first embodiment, in the same manner as the prior art, when the threshold varies from the position b to b#, it is determined there is no variation in threshold.

Subsequently, data is read again from the memory cell 11 (S15). In the comparator 17, the previously latched data and the newly read data are compared (S16). When the comparison results in a coincidence, the verifying process ends.

In the first embodiment, by using a plurality of reference voltages to determine multiple values, the reading operation itself can increase its speed. Also, since the verifying process is performed only once, a higher speed can be achieved as compared with the prior art. Further, since the reference voltage generators have only three types of output, control can be easily performed.

SECOND EMBODIMENT

Figure 4:
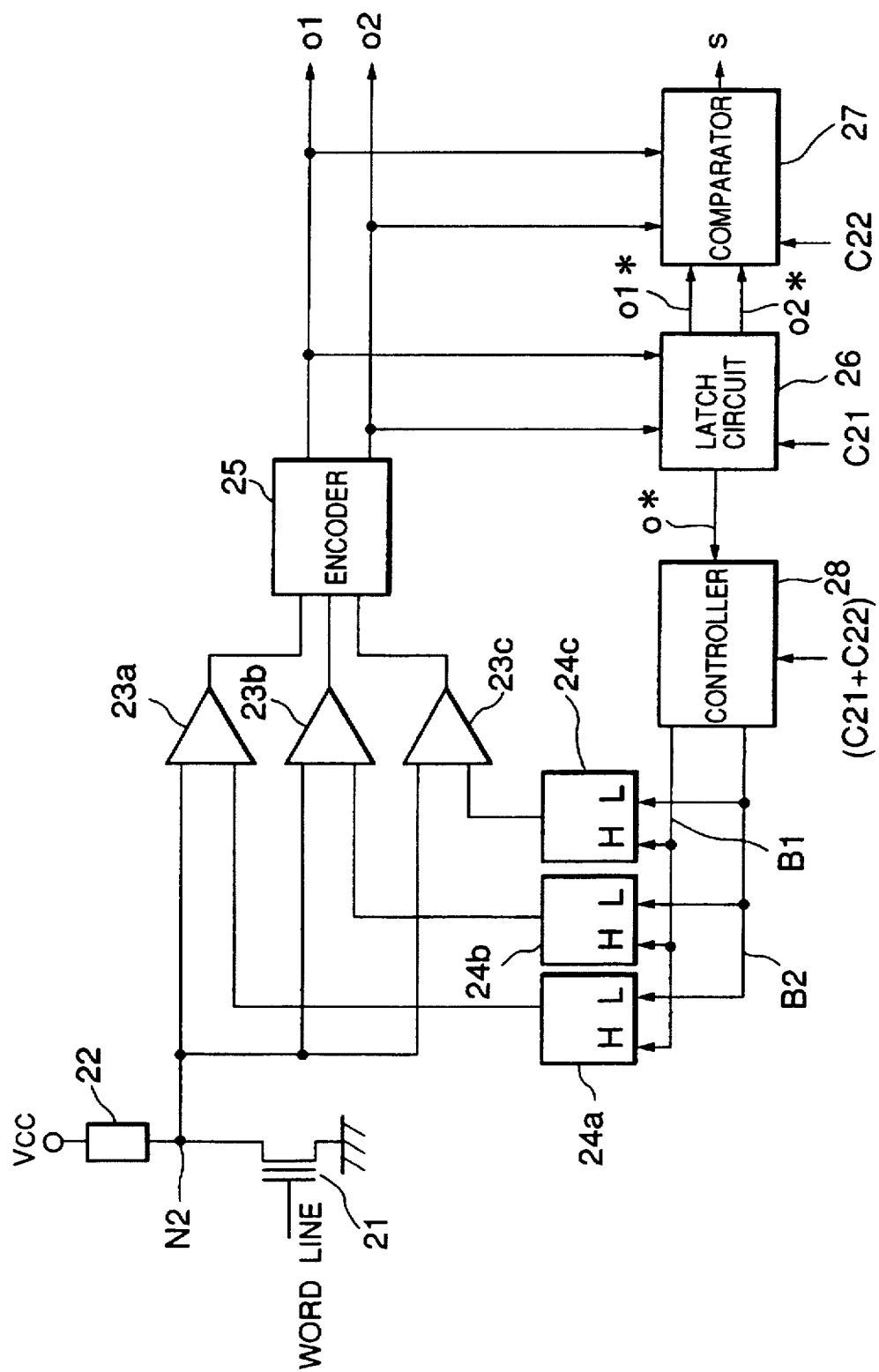
FIG. 4 is a circuit diagram showing a constitution of a semiconductor memory device according to a second embodiment of the invention.
Figure 5:
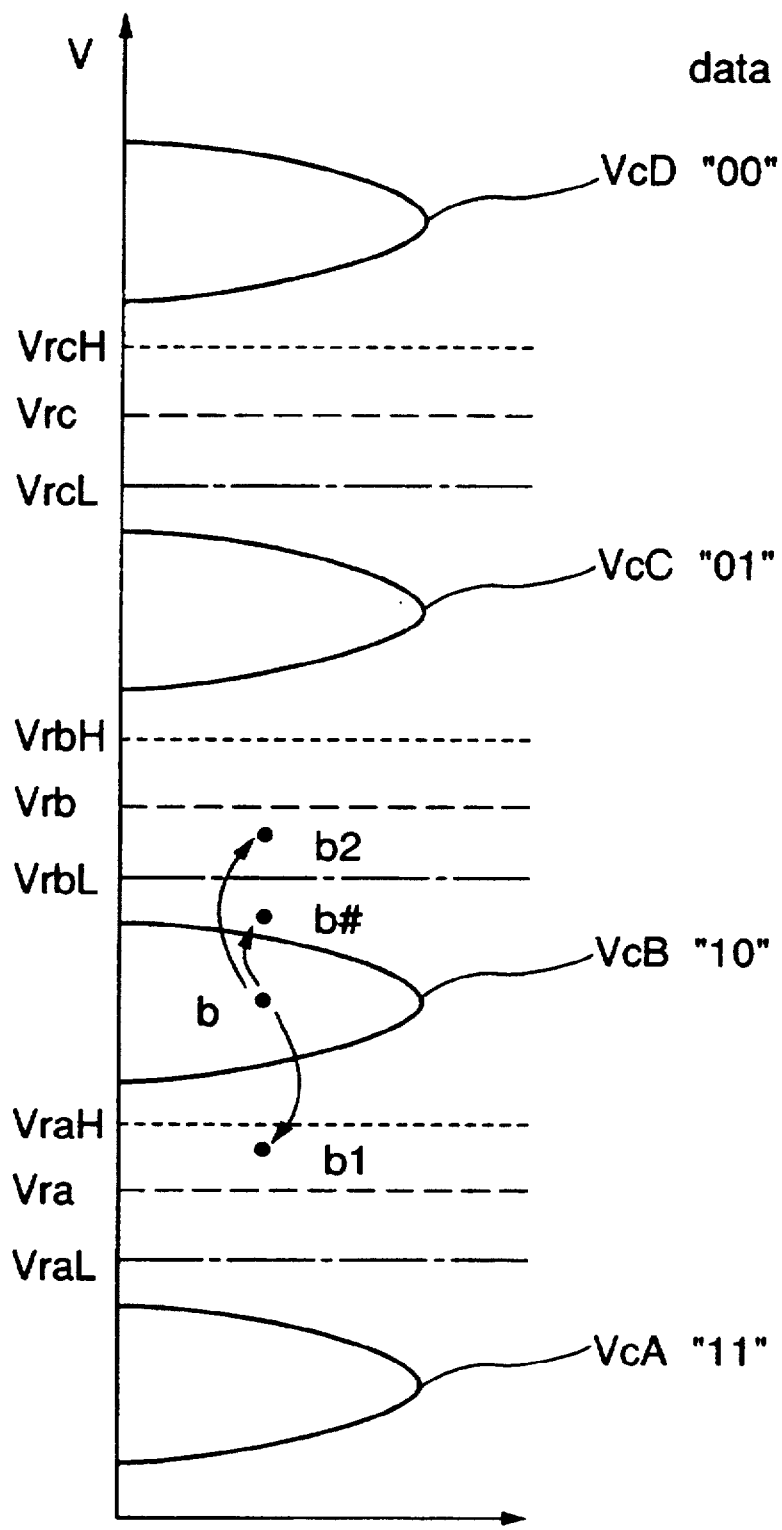
FIG. 5 is a voltage distribution diagram showing a method of determining multiple values and threshold variations in FIG. 4.
Figure 6:
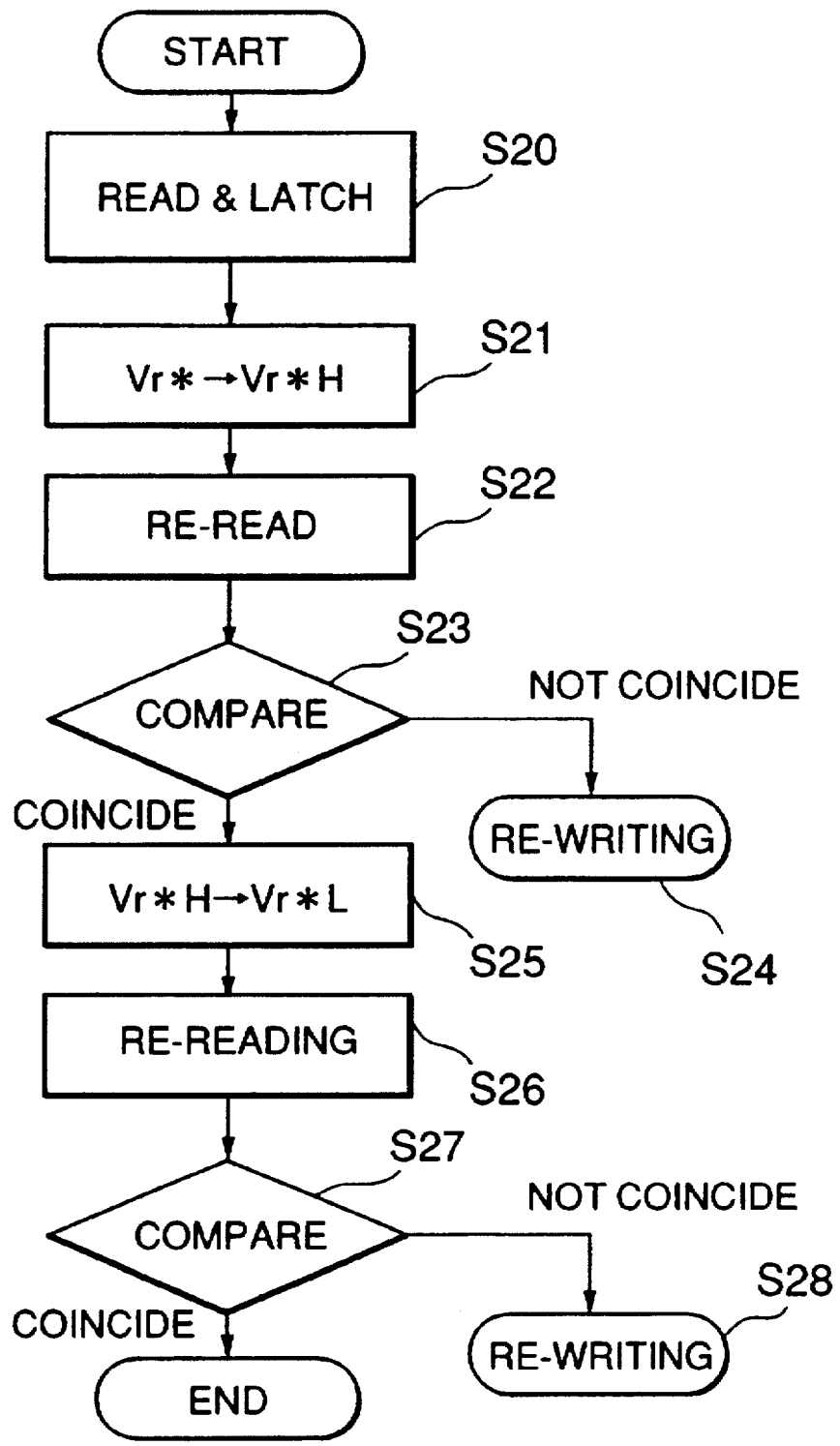
FIG. 6 is a flowchart showing operation of FIG. 4.

FIG. 4 is a circuit diagram showing a constitution of a semiconductor memory device in a second embodiment of the invention. FIG. 5 is a voltage distribution diagram showing a method of determining multiple values and threshold variations in FIG. 4. FIG. 6 is a flowchart showing operation of FIG. 4.

The semiconductor memory device shown in FIG. 4 has a floating gate MOS structure as the circuit constitution, and is constituted of a memory cell 21, a load 22, differential amplifiers 23a to 23c, reference signal generators 24a to 24c, an encoder 25, a latch circuit 26, a comparator 27 and a controller 28. A drain terminal of the memory cell 21 and the load 22 are connected parallel with a contact N2 in a circuit.

The memory cell 21 stores in one cell four values (binary two bits) of data as different thresholds. The reference signal generators 24a to 24c all have input of control signals B1 and B2, and emit reference signals Vra, Vrb, Vrc used for usual reading and reference signals used for verifying operation VraL and VraH, VrbL and VrbH, VrcL and VrcH, in accordance with B1 and B2. The differential amplifiers 23a to 23c read from the memory cell 21 either one of signals corresponding to the stored data of levels VcA, VcB, VcC, VcD at the contact N2, and each receives each signal at one input terminal. Respective outputs of the reference signal generators 24a to 24c are transmitted to the other input terminals. The encoder 25 converts the output of the differential amplifiers 23a to 23c into binary data, and emits data o1 and o2. The latch circuit 26 latches the data o1 and o2 emitted from the encoder 15 at a timing of a clock signal C21, and emits data o1* and o2*. The comparator 27 receives and compares the data o1, o2 emitted from the encoder 25 and the data o1*, o2* emitted from the latch circuit 26 at a timing of a clock signal C22. When the comparison results in non-coincidence, a threshold voltage variation signal s is emitted. The controller 28 receives data o* latched in the latch circuit 26 and the clock signals (C21+C22), send emits the control signals B1 and B2.

The second embodiment shown in FIG. 4 is different in constitution from the first embodiment shown in FIG. 1 in that the controller 28 receives the output of the latch circuit 26 and the clock signals (C21+22), and emits two control signals B1, B2.

As shown in FIG. 5, VcA to VcD show a voltage distribution at the contact N2 when the stored data in the memory cell 21 is read out, and correspond to the stored data "11", "10", "01" and "00", respectively The reference signals Vra, Vrb and Vrc are used for usual reading by using the reference signal generators 24a to 24c, respectively. The reference signals VraL and VraH, VrbL and VrbH, and VrcL and VrcH are used at the time of verifying. The reference signals VraH, VrbH, VrcH are signals shifted to the upper order as much as A $\Delta$V from the reference signals Vra, Vrb, Vrc, respectively. The reference signals VraL, VrbL, VrcL are signals shifted to the lower order as much as $\Delta$V from the reference signals Vra, Vrb, Vrc, respectively.

Using FIG. 6, operation of FIG. 3 is described. In FIG. 4, the operation from when data is read from the memory cell 21 out to the differential amplifiers 23a to 23c until the data is latched by the latch circuit 26 at the timing of clock signal C21 (S20) is the same as the operation of the first embodiment. After at the timing of clock signal C21, the data is latched in the latch circuit 26, the controller 28 emits the control signal B1, and converts an output level of the reference signal generators 24a to 24c from Vrx to VrxH (S21). Thereafter, again the data in the memory cell 21 is read (S22), and compared with the previous data at the timing of clock signal C22 (S23).

Here, as shown in FIG. 5, when the threshold varies from the position b to b1, the threshold voltage variation signal s is emitted, thereby ending the verifying process, and a repair operation, i.e. re-writing is performed (S24). When no variation in threshold is detected, then the controller 28 emits the signal B2 at the timing of clock signal C22, and converts the output level of the reference signal generators 24a to 24c from VrxH to VrxL (S25). In this condition, again the data is read (S26), and compared with the previous data at the timing of clock signal C22 to detect a variation in threshold (S27).

Here, when the threshold varies, the threshold voltage variation signal s is emitted, ending the verifying process, and re-writing is performed (S28). When no variation in threshold is detected, the process ends.

In the second embodiment, dependent on the direction of variation in threshold, the verifying process needs to be repeated twice. However, since the controller 28 emits only two control signals, the circuit constitution can be simplified as compared with the first embodiment. Also, even when the verifying process is repeated twice, the verifying process can be performed at a higher speed as compared with the prior art.

In the aforementioned first and second embodiments, the memory cells 11 and 21 with a data structure of m-ary, k bits have been described, but the case is the same even when storing only n-values of data.

THIRD EMBODIMENT

Figure 7:
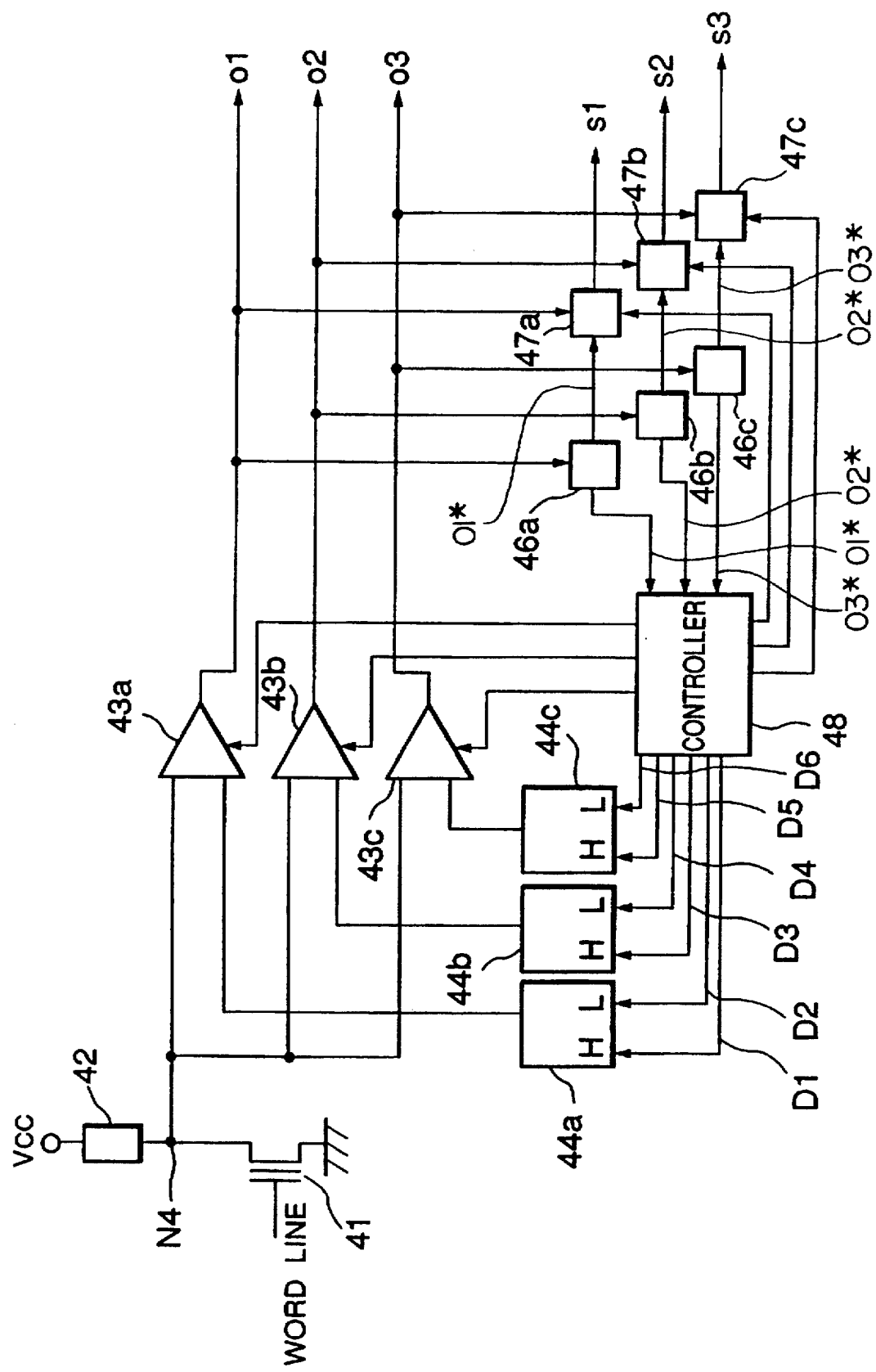
FIG. 7 is a circuit diagram showing a constitution of a semiconductor memory device according to a third embodiment of the invention.
Figure 8:
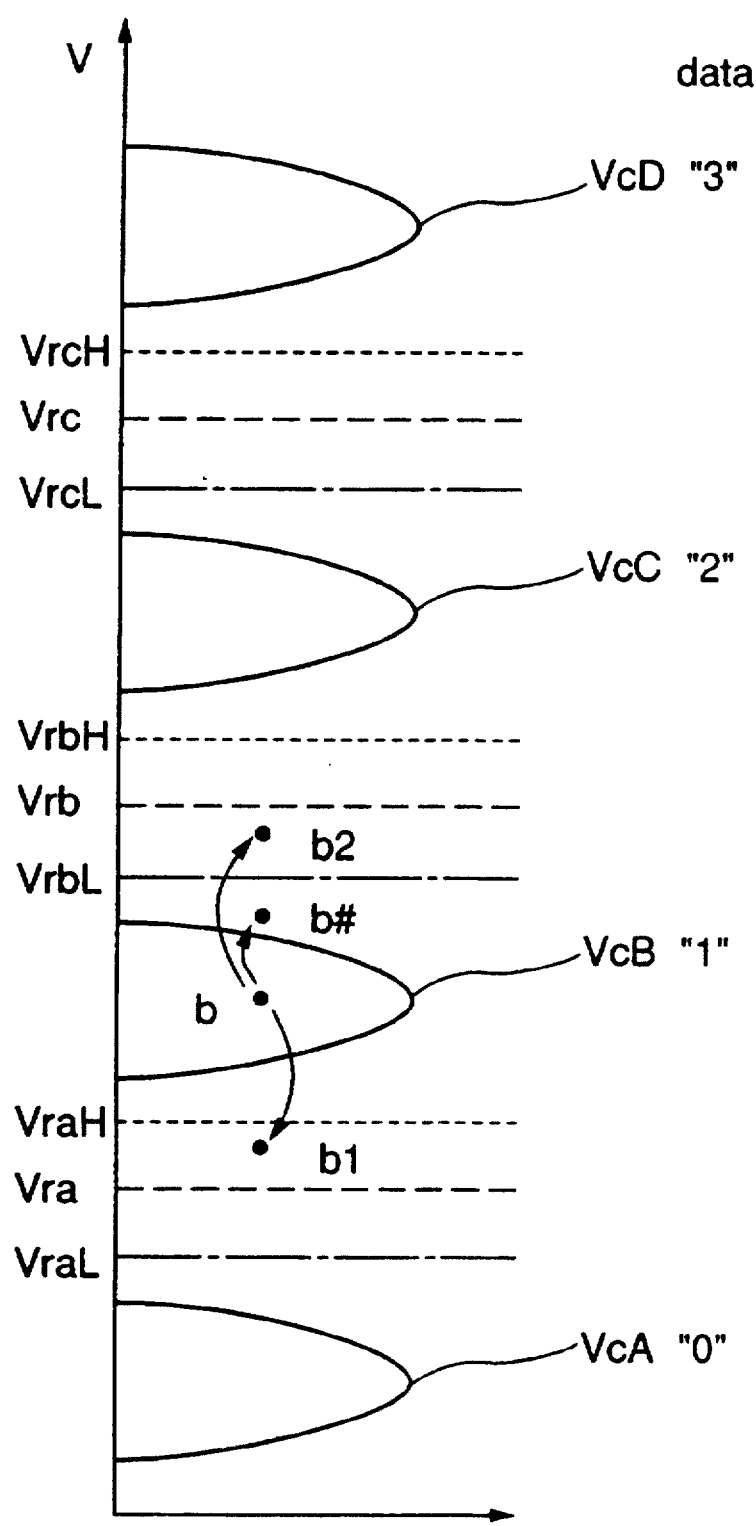
FIG. 8 is a voltage distribution diagram showing a method of determining multiple values and threshold variations in FIG. 7.

FIG. 7 is a circuit diagram showing a constitution of a semiconductor memory device in a third embodiment of the invention. FIG. 8 is a voltage distribution diagram showing a method of determining multiple values and threshold variations in FIG. 7.

The semiconductor memory device shown in FIG. 7 has a floating gate MOS structure as the circuit constitution, and is constituted of a memory cell 41, a load 42, differential amplifiers 43a to 43c, reference signal generators 44a to 44c, latch circuits 46a to 46c, comparators 47a to 47c and a controller 48. A drain terminal of the memory cell 41 and the load 42 are connected parallel with a contact N4 in a circuit.

The memory cell 41 stores in one cell four values of data as different thresholds. The reference signal generators 44a to 44c have input of control signals D1 and D2, D3 and D4, D5 and D6, respectively, and emit reference signals Vra, Vrb, Vrc used for usual reading and reference signals used for verifying operation VraL and VraH, VrbL and VrbH, VrcL and VrcH, in accordance with D1 to D6. The differential amplifiers 43a to 43c read from the memory cell 41 either one of signals of levels VcA, VcB, VcC, VcD at the contact N4 corresponding to the stored data, and each receives each signal at one input terminal. Respective outputs of the reference signal generators 44a to 44c are transmitted to the other input terminals. The latch circuits 46a to 46c receive data o1, o2 and o3 which are binary data converted and emitted by the differential amplifiers 43a to 43c, and emit data o1*, o2* and o3*, respectively. The comparators 47a to 47c receive and compare the data o1, o2 and o3 emitted from the differential amplifiers 43a to 43c and the data o1*, o2* and o2* emitted from the latch circuits 46a to 46c. When the comparison results in non-coincidence, threshold voltage variation signals s1 to s3 are emitted. The controller 48 receives the data o1*, o2* and o3* latched in the latch circuits 46a to 46c, emits the control signals D1 to D6, and also controls the differential amplifiers 43a to 43c and the comparators 47a to 47c.

The third embodiment shown in FIG. 7 is different from the first embodiment shown in FIG. 1 in that no encoder is provided, and the latch circuits 46a to 46c and the comparators 47a to 47c are provided for respective outputs of the differential amplifiers 43a to 43c. Also in FIG. 7, the controller 48 controls not only the reference signal generators 44a to 44c but also the comparators 47a to 47c and the differential amplifiers 43a to 43c.

As shown in FIG. 8, VcA to VcD show a voltage distribution at the contact N4 when the stored data in the memory cell 41 is read out, and correspond to the stored data "0", "1", "2" and "3", respectively. The reference signals Vra, Vrb and Vrc are used for usual reading by using the reference signal generators 44a to 44c, respectively. The reference signals VraL and VraH, VrbL and VrbH, and VrcL and VrcH are used at the time of verifying. The reference signals VraH, VrbH, VrcH are signals shifted to the upper order by $\Delta$V from the reference signals Vra, Vrb, Vrc, respectively. The reference signals VraL, VrbL, VrcL are signals shifted to the lower order by $\Delta$V from the reference signals Vra, Vrb, Vrc, respectively.

At the time of verifying, when determining VcB in the same manner as the first embodiment, the stored data in the memory cell 41 is read, and signals "1", "0" and "0" emitted as o1 to o3 from the differential amplifiers 43a to 43c are latched in the latch circuits 46a to 46c. The reference signals necessary for determining a variation in threshold of data "1" are, as shown in FIG. 8, VraH and VrbL. Therefore, the controller 48 emits only D2 and D3, and further emits a signal to stop the differential amplifier 43c and the comparator 47c. Thereby, the subsequent reading is performed using only the reference signals VraH and VrbL. The data is compared only by the comparators 47a and 47b. Here, when the potential of the contact N4, i.e. the threshold varies from the position b to b1, the comparison by the comparator 47a of the data latched in the latch circuits 46a to 46c and the newly read data results in non-coincidence, thereby emitting the threshold voltage variation signal s1. When the threshold varies to the position b2, the comparison of the comparator 47b results in non-coincidence, and the threshold voltage variation signal s2 is emitted. When the threshold voltage variation signals s1, s2 and s3 are emitted, the verifying process ends, and re-writing is performed. For determining other VcA, VcC and VcD, the same procedure is followed.

Figure 9:
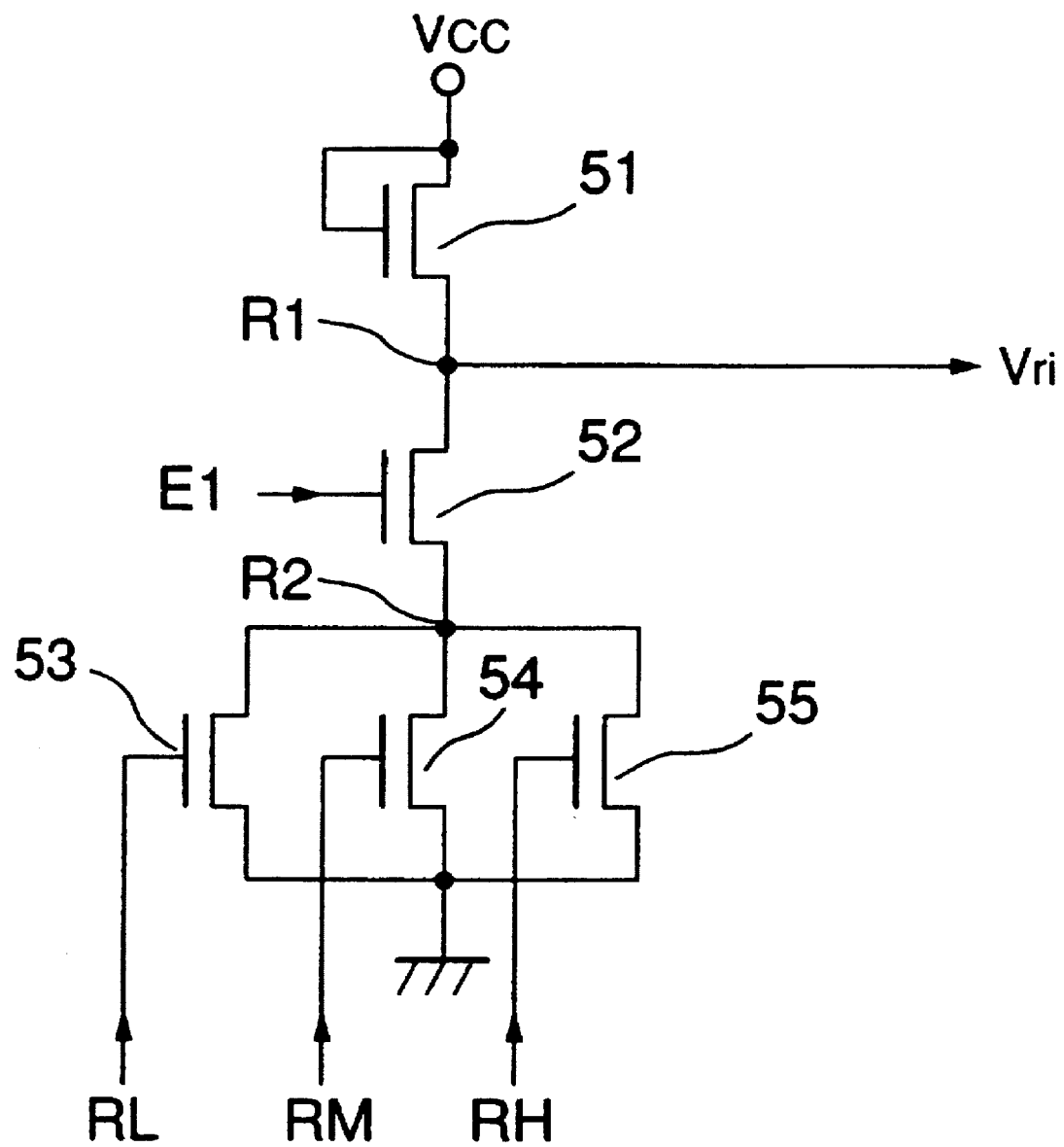
FIG. 9 is a circuit diagram showing a constitution of a reference signal generator for use in the embodiment of the invention.
Figure 10:
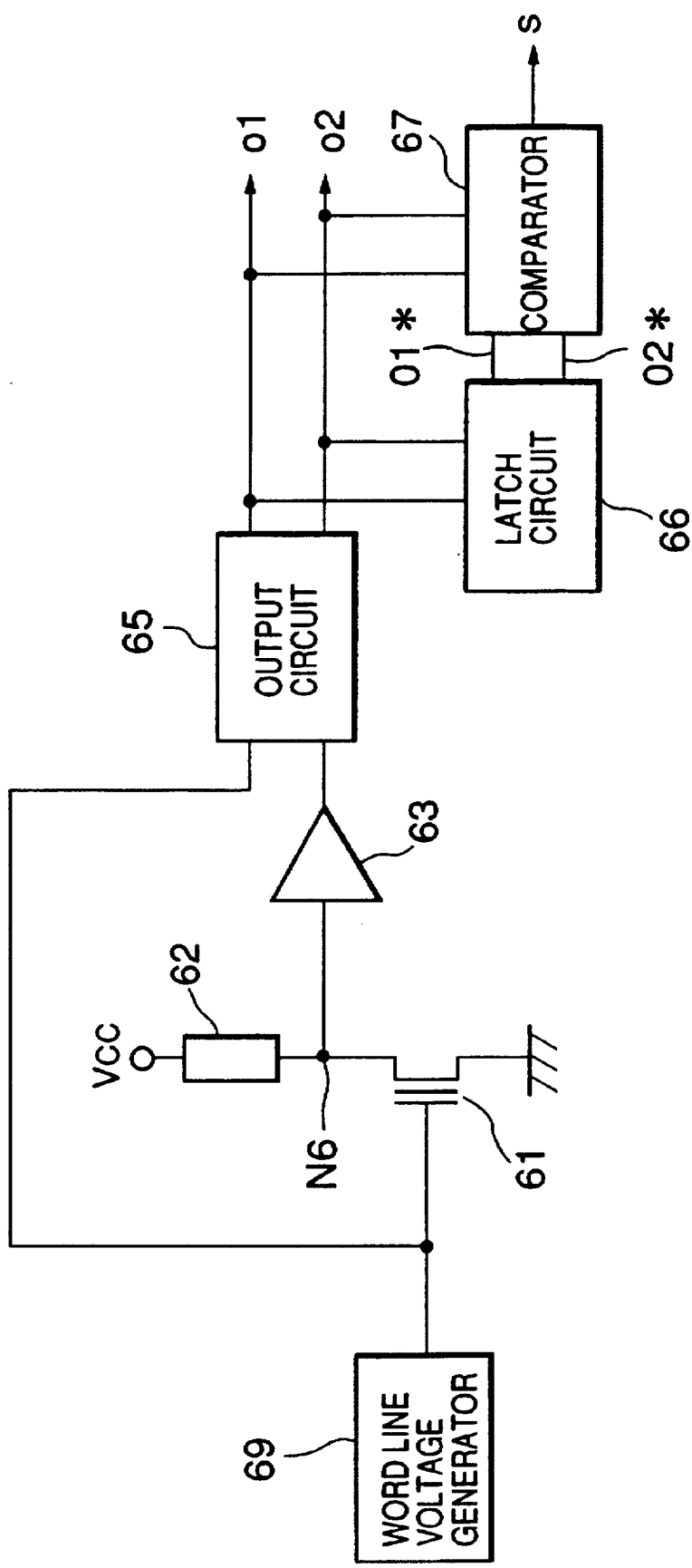
FIG. 10 is a circuit diagram showing a method of detecting threshold variations according to the prior art.
Figure 11:
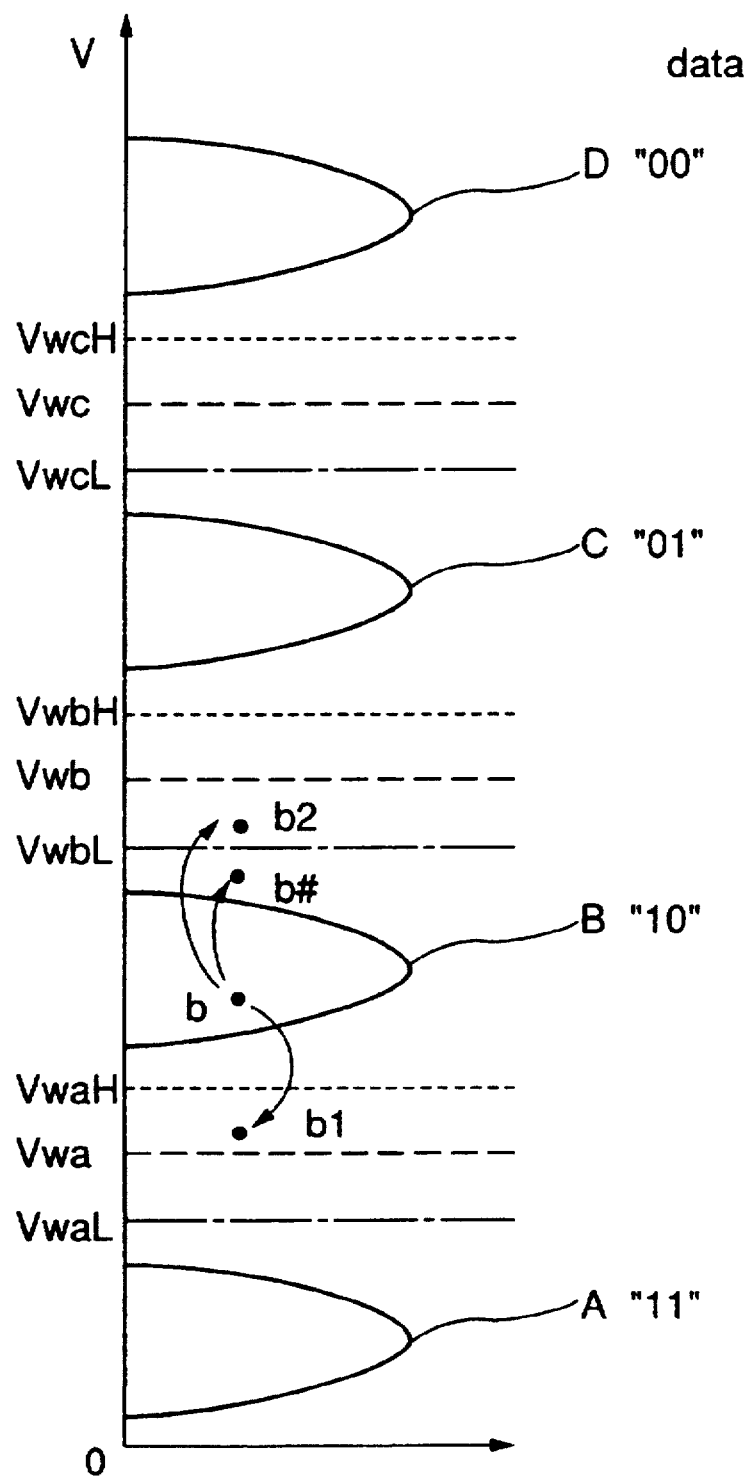
FIG. 11 is a voltage distribution diagram showing a method of determining multiple values and threshold in FIG. 10.

FIG. 9 is a circuit diagram showing a constitution of the reference signal generator used in the aforementioned first to third embodiments of the invention. An MOS transistor 51 has a drain and a gate which are connected to a power source Vcc, and a source connected to a contact R1. An MOS transistor 52 has a drain connected to the contact R1, a source connected to a contact R2 and a gate connected to a control signal E1. The MOS transistors 51 and 52 form loads, respectively.

MOS transistors 53, 54 and 55 have drains connected to the contact R2, sources connected to a ground potential GND and gates connected to control signals RL, RM and RH, respectively. The voltage of the contact R1 is used as the reference signal Vri. The control signal E1 is at a high level when the reference signal generator is operating. In the reference signal generator, by controlling conductive conditions of the MOS transistors 53, 54 and 55, the level of the reference signal is varied. A control method is as follows.

(1) When emitting Vri, with RM and RH, electricity is conducted to the MOS transistors 54 and 55. When emitting VriH, with RH, electricity is conducted only to the MOS transistor 55. When emitting VriL, with RL, RM and RH, electricity is conducted to all the transistors 53, 54 and 55. In this manner, a synthesized resistance of the MOS transistors is used for control.

When this method is applied to the first embodiment, during reading, RH is set to a high level and electricity is conducted. To RM either one of the signals A1, A3 and A5 is connected, and to RL either one of the signals A2, A4 and A6 is connected. In the initial condition, A1, A3 and A5 are at a high level and A2, A4 and A6 are at a low level. When emitting VriH, A1, A3 and A5 are set to a low level, and electricity is conducted only to the transistor 55. When emitting VriL, A2, A4 and A6 are set to a high level, and electricity is conducted to all the transistors 53, 54 and 55.

(2) Conducting resistances TRxx of the MOS transistors 53, 54 and 55 are set to TR53<TR54<TR55. When emitting Vri, with RM, electricity is conducted to the transistor 55. When emitting VriH, with RH, electricity is conducted to the transistor 55. When emitting VriL, with RL, electricity is conducted to the transistor 53.

As aforementioned, in the multi-valued nonvolatile semiconductor memory of the invention, by determining multiple values with a plurality of reference voltages, the word line voltage advantageously needs not to be changed over. Also, by comparing the bit line voltages of the memory cell read with the fixed word line voltage to determine data at once, the reading operation itself can advantageously increase its speed. Further, by fixing the word line voltage, the circuit constitution of the word line voltage generator can be simplified.

Also, since the reference voltage for the verifying process can be changed only once or twice, the frequency of the verifying process can be decreased as compared with the prior art, and the verifying process can have a high speed. Also, since three types of output are emitted from the individual reference signal generators, the circuit constitution can be simplified as compared with the prior art.

Consequently, the variation in threshold of the memory cell in the multi-valued nonvolatile semiconductor memory can be detected at a higher speed.

What is claimed is:

1. A multi-valued nonvolatile semiconductor memory having a floating gate MOS structure as a circuit constitution, provided with a nonvolatile memory cell for storing n-values (n=3, 4, 5, . . . ) of data as different thresholds in one cell, (n−1) units of reference signal generators for emitting a first group of different reference signals Vri (i=1, 2, . . . , (n−1)), and (n−1) units of differential amplifiers for reading from said nonvolatile memory cell either one of different signals Vci (i=1, 2, . . . , (n−1); Vci<Vri<Vc(i+1)) corresponding to the n-values of stored data, the read signal being transmitted to one input terminals and said different reference signals of the first reference signal group Vri being transmitted to the other input terminals, which comprises:

(n−1) units of latch circuits for latching respective outputs of said differential amplifiers, (n−1) units of comparators for comparing the outputs of said differential amplifiers with respective outputs of said latch circuits, and a controller for emitting a control signal in accordance with the outputs of said latch circuits and controlling said differential amplifiers and said comparators, said reference signal generators being constituted to emit said first reference signal group Vri, a second reference signal group VriH (Vri<VriH<Vc(i+1)) shifted as much as ΔV to an upper order from said first reference signal group Vri in accordance with said control signal, and a third reference signal group VriL (Vci<VriL<Vri) shifted as much as ΔV to a lower order from said first reference signal group Vri in accordance with said control signal.

2. The multi-valued nonvolatile semiconductor memory according to claim 1, which comprises a first operation in which by using said first reference signal group Vri emitted by said reference signal generators, the stored data in said nonvolatile memory cell is read out to said differential amplifiers, a second operation in which said latch circuits latch first output of said differential amplifiers, a third operation in which when said signal Vci is Vcx (x being either one of 1, 2, . . . , (n−1)), said controller generates said control signal and changes Vr(x−1) and Vrx of said first reference signal group Vri to the second reference signal Vr(x−1) H and the third reference signal VrxL, respectively, a fourth operation in which by using said changed second reference signal Vr(x−1) H and said third reference signal VrxL emitted from said reference signal generators, the stored data in said nonvolatile memory cell is again read out to said differential amplifiers, and a fifth operation in which said comparators compare said first output of said differential amplifiers latched in said latch circuits by said second operation with new second output of said differential amplifiers read by said fourth operation, as a result of comparison in said fifth operation, a threshold voltage variation signal being emitted, thereby ending a verifying process, when said first output does not coincide with said second output.

3. A multi-valued nonvolatile semiconductor memory having a floating gate MOS structure as a circuit constitution, provided with a nonvolatile memory cell for storing $m^k$-values (an integer of $m \geq 2$, an integer of $k \geq 2$ ($m=2$), or an integer of $k \geq 1$ ($m \geq 3$)) of data as different thresholds; ($m^k-1$) units of reference signal generators for emitting a first group of different reference signals Vri ($i=1, 2, \ldots, (m^k-1)$); ($m^k-1$) units of differential amplifiers for reading from said nonvolatile memory cell either one of different signals Vci ($i=1,2, \ldots, (m^k-1)$; Vci<Vri<Vc(i+1)) corresponding to the $m^k$-values of stored data, the read signal being transmitted to one input terminals and said respective different reference signals of the first reference signal group Vri being transmitted to the other input terminals; and an encoder for receiving output of the differential amplifiers and converting to m-ary data, which comprises a latch circuit for latching an output of said encoder at a first clock signal timing, a comparator for comparing the output of said encoder with an output of said latch circuit at a second clock signal timing, and a controller for emitting a control signal in accordance with the output of the latch circuit, said reference signal generators being constituted to emit said first reference signal group Vri, a second reference signal group VriH (Vri<VriH<Vc(i+1)) shifted as much as ΔV to an upper order from said first reference signal group Vri in accordance with said control signal, and a third reference signal group VriL (Vci<VriL<Vri) shifted as much as ΔV to a lower order from said first reference signal group Vri in accordance with said control signal.

4. The multi-valued nonvolatile semiconductor memory according to claim 3, which comprises a first operation in which by using said first reference signal group Vri emitted by said reference signal generators, the stored data in said nonvolatile memory cell is read out to said differential amplifiers, and said signal Vci is converted to a first m-ary data in said encoder, a second operation in which said latch circuit latches said first m-ary data at said first clock signal timing a third operation in which when said signal Vci is Vcx (x being either one of 1, 2, . . . , ($m^k-1$)), said controller generates said control signal and changes outputs of said reference signal generators from Vr(x-1) and Vrx of said first reference signal group Vri to the second reference signal Vr(x-1) H and the third reference signal VrxL, respectively a fourth operation in which by using said changed second reference signal Vr(x-1) H and said third reference signal VrxL emitted from said reference signal generators, the stored data in said nonvolatile memory cell is again read out to said differential amplifiers, and said signal Vci is converted to a second m-ary data in said encoder, a fifth operation in which said comparator compares said first m-ary data latched in said latch circuit by said second operation with said second m-ary data converted by said fourth operation at said second clock signal timing, and a sixth operation in which as a result of comparison in said fifth operation, when said first m-ary data coincides with said second m-ary data, a verifying process is ended, and when said first m-ary data does not coincide with said second m-ary data, a threshold voltage variation signal is emitted, thereby ending the verifying process.

5. The multi-valued nonvolatile semiconductor memory according to claim 3, which comprises a first operation in which by using said first reference signal group Vri emitted by said reference signal generators, the stored data in said nonvolatile memory cell is read out to said differential amplifiers, and said signal Vci is converted to a first m-ary data in said encoder, a second operation in which said latch circuit latches said first m-ary data at said first clock signal timing, a third operation in which outputs of said reference signal generators are changed from said first reference signal group Vri to the second reference signal VriH, a fourth operation in which by using said changed second reference signal VriH emitted from said reference signal generators, the stored data in said nonvolatile memory cell is again read out to said differential amplifiers, and said signal Vci is converted to a second m-ary data in said encoder, a fifth operation in which said comparator compares said first m-ary data latched by said second operation with said second m-ary data converted by said fourth operation for the first time at said second clock signal timing, a sixth operation in which as a result of comparison in said fifth operation, when said first m-ary data coincides with said second m-ary data, the operation advances to a seventh operation, and when said first m-ary data does not coincide with said second m-ary data, a first threshold voltage variation signal is emitted, ending the verifying process, the seventh operation in which the outputs of said reference signal generators are changed from the second reference signal VriH to the third reference signal VriL, an eighth operation in which by using said changed third reference signal VriL emitted from said reference signal generators, the stored data in said nonvolatile memory cell is further again read out to said differential amplifiers, and said signal Vci is converted to a third m-ary data in said encoder, a ninth operation in which said comparator compares said first m-ary data latched by said second operation with said third m-ary data converted by said eighth operation for the second time at said second clock signal timing, and a tenth operation in which as a result of comparison in said ninth operation, when said first m-ary data coincides with said third m-ary data, the verifying process is ended, and when said first m-ary data does not coincide with said third m-ary data, a second threshold voltage variation signal is emitted, ending the verifying process.

6. The multi-valued nonvolatile semiconductor memory according to claim 1, wherein each of said reference signal generators has a first load provided with an MOS transistor connected between a power source and a first contact, a second load provided with an MOS transistor connected between said first contact and a second contact, and first, second and third MOS transistors with drains connected to said second contact, sources connected to a ground potential and gates connected to control signals, respectively, a voltage of said first contact is used as a reference signal, when emitting said first reference signal Vri, electricity is conducted to the first and second MOS transistors, when emitting said second reference signal VriH, electricity is conducted only to said first MOS transistor, and when emitting said third reference signal VriL, electricity is conducted to all said first, second and third MOS transistors.

7. The multi-valued nonvolatile semiconductor memory according to claim 1, wherein each of said reference signal generators has a first load provided with an MOS transistor connected between a power source and a first contact, a second load provided with an MOS transistor connected between said first contact and a second contact, and first, second and third MOS transistors with drains connected to said second contact, sources connected to a ground potential and gates connected to control signals, respectively, a voltage of said first contact is used as the reference signal, respective conducting resistances TR3, TR2 and TR1 of said first, second and third MOS transistors have a relationship of TR1<TR2<TR3, when emitting said first reference signal Vri, electricity is conducted to said second MOS transistor, when emitting said second reference signal VriH, electricity is conducted to said first MOS transistor, and when emitting said third reference signal VriL, electricity is transmitted to said third MOS transistor.

8. The multi-valued nonvolatile semiconductor memory according to claim 3, wherein each of said reference signal generators has a first load provided with an MOS transistor connected between a power source and a first contact, a second load provided with an MOS transistor connected between said first contact and a second contact, and first, second and third MOS transistors with drains connected to said second contact, sources connected to a ground potential and gates connected to control signals, respectively, a voltage of said first contact is used as a reference signal, when emitting said first reference signal Vri, electricity is conducted to the first and second MOS transistors, when emitting said second reference signal VriH, electricity is conducted only to said first MOS transistor, and when emitting said third reference signal VriL, electricity is conducted to all said first, second and third MOS transistors.

9. The multi-valued nonvolatile semiconductor memory according to claim 3, wherein each of said reference signal generators has a first load provided with an MOS transistor connected between a power source and a first contact, a second load provided with an MOS transistor connected between said first contact and a second contact, and first, second and third MOS transistors with drains connected to said second contact, sources connected to a ground potential and gates connected to control signals, respectively, a voltage of said first contact is used as the reference signal, respective conducting resistances TR3, TR2 and TR1 of said first, second and third MOS transistors have a relationship of TR1<TR2<TR3, when emitting said first reference signal Vri, electricity is conducted to said second MOS transistor, when emitting said second reference signal VriH, electricity is conducted to said first MOS transistor, and when emitting said third reference signal VriL, electricity is transmitted to said third MOS transistor.

* * * * *